US007543681B2

(12) United States Patent
Howard et al.

(10) Patent No.: US 7,543,681 B2
(45) Date of Patent: Jun. 9, 2009

(54) ARCHITECTURAL SPEAKER ASSEMBLY

(75) Inventors: R. Brent Howard, Lehi, UT (US); Christopher A. Swan, Templeton, CA (US)

(73) Assignee: Audio Technologies, Inc., Columbus, IN (US)

( * ) Notice: Subject to any disclaimer, the term of this patent is extended or adjusted under 35 U.S.C. 154(b) by 413 days.

(21) Appl. No.: 11/334,739

(22) Filed: Jan. 17, 2006

(65) Prior Publication Data

US 2006/0177088 A1 Aug. 10, 2006

Related U.S. Application Data

(60) Provisional application No. 60/643,949, filed on Jan. 14, 2005.

(51) Int. Cl.
*H05K 5/00* (2006.01)
*H04R 1/02* (2006.01)

(52) U.S. Cl. ........................ 181/150; 381/389; 381/391

(58) Field of Classification Search ................. 181/150; 381/391, 389
See application file for complete search history.

(56) References Cited

U.S. PATENT DOCUMENTS 2,532,413 A * 12/1950 Levy .......................... 381/420
3,651,796 A * 3/1972 Nelson ....................... 126/215
3,752,055 A * 8/1973 Shuler ........................ 454/332
3,830,334 A * 8/1974 Costa ......................... 181/131
4,281,224 A * 7/1981 Castagna .................... 381/391
4,331,841 A * 5/1982 Castagna .................... 381/186
4,439,643 A * 3/1984 Schweizer .................. 381/395
4,507,800 A * 3/1985 Kelly ......................... 381/393
4,565,905 A * 1/1986 Nation ....................... 381/186
4,602,382 A * 7/1986 Gabbay et al. .............. 381/391
5,322,979 A * 6/1994 Cassity et al. ............... 181/150
5,444,194 A * 8/1995 Reinke ....................... 181/150
5,652,413 A * 7/1997 Mulera ....................... 181/141
5,761,323 A * 6/1998 Kameda et al. ............. 381/386
5,828,765 A * 10/1998 Gable ......................... 381/386
5,844,999 A * 12/1998 Kameda et al. ............. 381/386
5,949,898 A * 9/1999 Proni ......................... 381/398
6,047,077 A * 4/2000 Larsen ....................... 381/412
6,101,262 A * 8/2000 Haase et al. ................ 381/386
6,142,254 A * 11/2000 Claybaugh et al. .......... 181/199
6,354,397 B1 * 3/2002 Combest et al. ............. 181/199
6,427,019 B1 * 7/2002 Ketterer et al. .............. 381/386
6,568,503 B2 * 5/2003 Proni ......................... 181/172
6,661,898 B2 * 12/2003 Kuwabara .................... 381/87
6,741,720 B1 * 5/2004 Myatt ......................... 381/386
6,870,943 B2 * 3/2005 Liu ............................ 381/395
7,031,487 B2 * 4/2006 Stiles ......................... 381/398
7,043,045 B2 * 5/2006 Takahashi ................... 381/398
7,266,211 B2 * 9/2007 Ikeuchi ....................... 381/391
7,282,683 B2 * 10/2007 Yamauchi et al. ........... 219/757

(Continued)

*Primary Examiner*—Walter Besnon
*Assistant Examiner*—Christina Russell
(74) *Attorney, Agent, or Firm*—Maginot, Moore & Beck

(57) ABSTRACT

An architectural speaker assembly includes a speaker supported within the speaker enclosure of a mounting fixture. A grill is provided to conceal the speaker. A grill support is configured to support the grill substantially flush with a facing ring of the mounting fixture to blend into the surrounding ceiling or wall. The grill support includes a concave wall that surrounds the speaker. A number of bosses project form the wall, each boss supporting a permanent magnet that magnetically engages the grill to firmly hold it on the grill support.

11 Claims, 2 Drawing Sheets

U.S. PATENT DOCUMENTS

2004/0037445 A1* 2/2004 Kirihara et al. ............ 381/389
2005/0276436 A1* 12/2005 Kobayashi et al. .......... 381/409
2005/0281429 A1* 12/2005 Rivera ........................ 381/391
2005/0286735 A1* 12/2005 Ikeuchi ....................... 381/391
2006/0292978 A1* 12/2006 Romanuik .................. 454/276
2007/0098206 A1* 5/2007 Ando et al. ................. 381/391
2007/0274554 A1* 11/2007 Sumitani et al. ............ 381/391
2007/0284183 A1* 12/2007 Whitaker .................... 181/150
2008/0044053 A1* 2/2008 Belanger et al. ............ 381/391

* cited by examiner

ARCHITECTURAL SPEAKER ASSEMBLY

This application claims the benefit of U.S. Provisional Patent Application No. 60/643,949, filed Jan. 14, 2005, and which is incorporated herein by reference.

FIELD OF THE INVENTION

The present invention relates to architectural speakers, and especially to speakers that are installed into a ceiling or wall to blend in with other typical fixtures.

BACKGROUND

Architectural speakers are designed to present a visual impression that does not interrupt the visual impression of a room. In room sound systems, it is often desirable to place the speakers in the ceiling, out of the normal line of sight. The speakers themselves have been engineered to deliver uniform and clear sound throughout the listening area. In one typical speaker design, the speaker is co-axial, meaning that the tweeter, or high frequency speaker, is located in the middle of the woofer, or low/mid frequency speaker. This configuration not only optimizes the acoustic performance of the architectural speaker, it also minimizes the profile or envelope occupied by the speaker. From a performance standpoint, this reduced profile allows the use of a larger woofer for richer low end performance. From an aesthetic standpoint, the reduced profile presents as small a disruption as possible to the overall decor of the room as possible.

Perhaps the most important component of the aesthetics of an architectural speaker assembly is the grill, or speaker cover. The grill covers the speaker components (woofer and tweeter) which are usually not designed for their aesthetic appeal. The grill or speaker cover is also configured at a minimum to avoid interfering with the sound quality of the speaker, and at a maximum to help enhance the sound performance.

In many cabinet-style speakers, the speaker cover is composed of a cloth material that is often selected to present a particular visual impression. On the other hand, for the typical architectural speaker, especially for the in-ceiling speaker, it is preferred that the grill be as "transparent" as possible with respect to the surrounding ceiling or wall. It is therefore desirable that the grill be configured to essentially blend into the surrounding surface. To help achieve that goal, the grills on most architectural speakers are formed of a material that can be easily painted to match the color of the surrounding surface.

Optimally, the grill is removably mounted to the speaker support structure. Removability allows ready access to the speaker components as needed. In addition, removability allows replacement of the speaker grill if it becomes damaged, or removal to touch-up or re-paint the grill. Many mounting mechanisms interrupt the desired clean, blended appearance of the grill. For instance, U.S. Pat. No. 5,828,765 shows one mounting mechanism in which the grill is held in place by external screws. The screws are partially concealed in recesses defined in the grill, which disrupts the grill surface. From a manufacturing approach, the grill design of the '765 Patent is complicated by the need to form the screw recesses.

In another approach, as represented by U.S. Pat. No. 6,568,503, clamp segments clamp the edge of the grill to an exposed edge of the speaker frame. This approach requires access to the sides of the grill for removal of the clamp segments, which thus necessitates a gap between the speaker grill and the surrounding wall or ceiling surface. Moreover, the use of the clamp segments requires that the edge of the grill be offset from the wall surface so that the grill does not present an uninterrupted surface in the room. A similar problem exists with the grill attachment mechanism in U.S. Pat. No. 5,322,979 in which the edges of the grill itself form clamp segments.

One design employs magnetic force from the speaker magnet to hold the speaker grill over the cone. While this approach addresses many of the shortcomings of other prior art, it has only been available in expensive speaker designs because it requires a speaker coil magnet that is sufficient strong and/or of a special or limited design that is close to the grill.

There is a need in the design of architectural speakers for a grill and grill attachment mechanism that does not disrupt the aesthetics of the room, and which does not result in a substantial increase in the price of the speaker. The attachment mechanism must permit easy removal and replacement of the grill, most preferably with the need for tools. The grill and attachment mechanism should not interfere with the acoustic performance of the speaker.

SUMMARY

The present invention addresses the above needs, as well as others, by providing a speaker having a housing that includes a magnetic interface with a grill. The speaker may take any suitable shape or size. In this manner, the problems of the prior art may be overcome without resorting to expensive speaker architectures.

A first embodiment of the invention is an architectural speaker system that includes a speaker, a mounting fixture, a grill, and a grill support. The mounting fixture is configured to support the speaker within a ceiling or wall or a room. The grill is configured to at least partially conceal the speaker. The grill support is engaged to the mounting fixture. The grill support defines a wall surrounding the speaker and has a inclined surface offset from said grill. The grill support includes a number of bosses projecting from the inclined surface toward the grill. A magnetic interface is provided between each of the bosses and the grill.

A second embodiment of the invention is an architectural speaker system having a speaker, a housing, a grill and a plurality of magnets. The housing is configured to support the speaker within a ceiling or wall or a room. The grill is configured to at least partially conceal the speaker. The plurality of magnets is disposed about the speaker and is fixably secured to the housing. The grill is configured to be magnetically retained in a fixed position with respect to the housing by the plurality of magnets.

The above described embodiments allow for flexibility in speaker design while obtaining the benefits of eliminating issues relating to other methods of coupling the speaker grill to the housing of an architectural speaker.

The above described features and advantages, as well as others, will become more readily apparent to those of ordinary skill in the art by reference to the following detailed description and accompanying drawings.

DESCRIPTION OF THE PREFERRED EMBODIMENT

Figure 1:
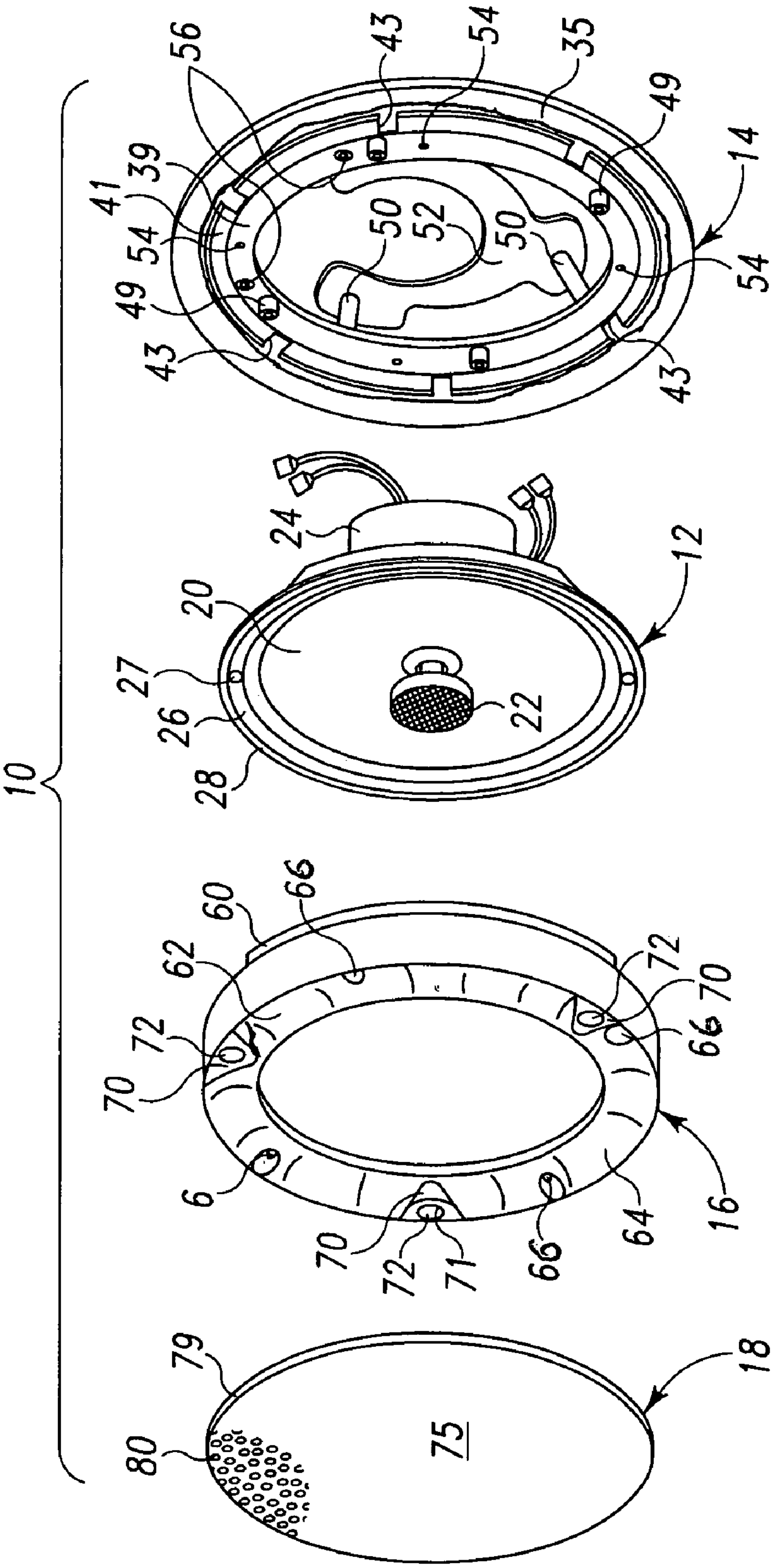
FIG. 1 is an exploded perspective view of the components of an architectural speaker assembly according to a preferred embodiment of the invention.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

Figure 2:
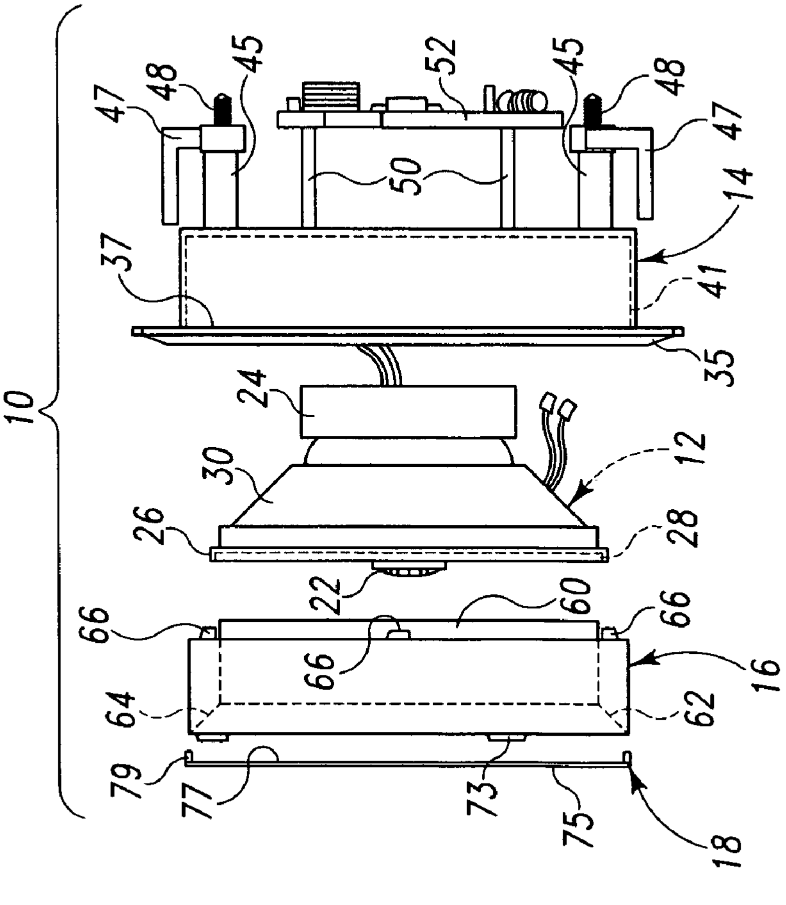
FIG. 2 is an exploded side of the architectural speaker assembly shown in FIG. 1.

In accordance with the present invention, an architectural speaker assembly 10 includes a speaker 12, mounting fixture 14, grill support 16 and grill 18, as shown in FIGS. 1-2. The speaker 12 can be of any known design. In the illustrated embodiment, the speaker is a co-axial speaker with a woofer 20 and a centrally supported tweeter 22. A magnet driver 24 drives a speaker cone 30 which floats between the woofer and tweeter and the magnet driver. The magnet driver is supported by a speaker frame that is attached to a mounting ring 26. The mounting ring 26 defines a number of mounting holes 27 through which pass screws to affix the speaker to the mounting fixture 14. An annular outer rim 28 is defined on the mounting ring that helps position the grill support 16 as described herein.

The speaker 12 is supported in a ceiling or a wall by a mounting fixture 14. In the illustrated embodiment, the fixture is configured for in-ceiling mounting of the architectural speaker assembly 10. The mounting fixture 14 therefore comprises a facing ring 35 that rests against the exposed ceiling surface when the speaker 10 is installed. The facing ring 35 is exposed to the room so it is preferably designed to complement the room aesthetics. In the preferred embodiment, the facing ring 35 is thin so its prominence beyond the ceiling surface is minimized. The frusto-conical shape of the ring improves its ability to blend into the surrounding ceiling surface. As with the grill 18, the facing ring 35 is formed of a material that can be easily painted to match the room decor. As with most of the mounting fixture, the facing ring 35 is preferably molded form a plastic material.

Integral with the facing ring 35 is a speaker enclosure 37 which includes a mounting ring 39 which supports the mounting ring 25 of the speaker. The mounting ring defines a number of screw bores 54 to receive the screws passing through the bores 27 in the speaker mounting ring to fix the speaker within the enclosure 37. The enclosure further includes a cylindrical side wall 41 that encircles the speaker 12 when it is mounted to the ring 39.

The side wall 41 also provides an interface with the grill support 16. To that end, the side wall defines a number of notches 43 that are provided to assist in removing the grill support 16 from the mounting fixture 14. A number of mounting bosses 56 project from the mounting ring 39 adjacent the side wall 41 to interface with bosses 66 (FIG. 2) on the grill support. Mounting screws pass through the mounting bosses 56 from the underside of the mounting fixture 14 and are threaded into the bosses 66 to attach the grill support to the mounting fixture. With this approach, the face (contoured wall 64) of the grill support is not interrupted by screw holes or mounting features used to fix the grill support to the mounting fixture.

The mounting fixture 14 is configured to be mounted within a ceiling or wall. It is therefore understood that the cylindrical wall 41 of the speaker enclosure 37 extends through a complementary hole cut into the ceiling or wall surface. The mounting components of the fixture may vary depending upon the material of the ceiling or wall. However, in the typical case, the room surfaces are formed from drywall or sheet rock, so direct mounting the wall surface is prohibitive. In most architectural speaker installations, the mounting fixture mates with a within-wall fixture that is attached to wall joists or beams. To that end, the mounting fixture 14 of the present embodiment includes hollow mounting posts 45 projecting from the back of the mounting ring 39. The mounting posts receive long screws 48 that may be wood screws to be driven into a support joist behind the speaker opening. The screws 48 are introduced from the front of the fixture 14 through screw bosses 49 (FIG. 1). The mounting posts 45 also slidably support mounting dogs 47 that are configured to clamp onto the within-wall fixture as the screws 48 are tightened. In particular, as the screws are tightened, the dogs 47 are driven forward into engagement with the other fixture. The mounting posts 45 are configured to allow rotation of the dogs 47 at the end of the posts, so that the mounting fixture 14 can be easily inserted or removed from the speaker opening in the ceiling or wall.

The fixture 14 also includes mounting posts 50 for supporting an electronics board 52. The electronics board includes components for driving and controlling the speaker 12, as are well-known in the art. The embodiments of the present invention may incorporate any suitable speaker electronics, including but not limited to those intended for architectural speakers.

As thus far described, the speaker 12 and mounting fixture 14 may be of a variety of known configurations that permit in-wall or in-ceiling mounting of the architectural speaker assembly 10. The installation of the speaker assembly 10 can proceed as is known in the art, since the present invention does not require alteration of these standard mounting configurations. However, with respect to the speaker grill 18, the present invention provides a different approach to supporting the grill that achieves the desired un-obtrusive aesthetic effect for the speaker assembly 10.

In particular, in accordance with one aspect of the invention, a grill support 16 is provided that mates within the speaker enclosure 37 of the mounting fixture 14. The grill support is generally in the configuration of an annular cylindrical structure, and is preferably formed of a plastic material. The grill support 16 is preferably in a dark color, such as black, to blend with the typical woofer 20. Moreover, the dark color of the grill support will keep it from being visible through the grill openings 80 (FIG. 1).

The grill support 16 includes an inner cylindrical wall 60 that is sized to bear against the mounting ring 26 of the speaker 12. The inner cylindrical wall 60 is also preferably sized for a snug fit within the rim 28 of the mounting ring. This inner wall 60 thus helps stabilize the speaker 12 when it is mounted to the mounting fixture 14, essentially clamping the speaker mounting ring 26 between the grill support and the fixture. This clamping significantly reduces spurious vibration of the speaker during operation.

The grill support 16 further comprises an outer cylindrical wall 62 concentrically disposed about the inner wall 60. The outer wall 62 is sized to fit snugly within the speaker enclosure 37, or more particular snugly against the fixture side wall 41. A tight fit between the grill support outer wall 62 and the fixture enclosure 37 also helps reduce spurious mechanical vibration of the speaker assembly 10. As explained above, the grill support 16 also includes screw bosses 66 that receive screws passing through the bosses 56 in the mounting fixture 14. It can be appreciated that the grill support 16 and speaker 12 are assembled with the mounting fixture 14 before the fixture is mounted within the ceiling or wall.

The grill support 16 defines a contoured annular wall 64. The wall 64 surrounds the speaker and is concave outwardly (see FIG. 2) from the face of the speaker. With this construction, the grill support does not impair the acoustic performance of the speaker 12. The contoured annular wall is essentially offset from the grill 18 to form an acoustic cavity immediately adjacent the driven speaker components which may enhance the sound quality by helping to direct the acoustic waves emanating from the woofer 20.

In accordance with one feature of the present invention, the grill support 16 is provided with a number of magnet bosses 70 projecting outward from the contoured wall 64. Each boss 70 supports a magnet 72 that is fixed within a bore in the boss. The magnet 72 may be an Alnico or neodium permanent magnet. The magnet 72 is preferably fixed within the boss 70 by epoxy or glue so that the magnet cannot be removed. Alternatively, the magnet may be press-fit or the boss may be configured to incorporate a lip at the opening of the bore 71 that physically restrains the magnet within the bore. It is especially important that the magnet 72 be fixed within the boss 70 where the speaker assembly 10 is an in-ceiling speaker to avoid the risk of accidental dislodgment of the magnets 72 from their respective bosses 70.

As contemplated, the grill 18 is formed of a magnetic material (i.e. a material that can be attracted to a permanent or electromagnetic force, but not necessarily having its own magnetic attractive force) so that the magnets 72 can easily hold the grill on the grill support 16, against the force of gravity. The magnets 72 must therefore be strong enough to resist gravity, but are also preferably strong enough to hold the grill in place even when subject to a moderate external force. In the illustrated embodiment, three magnets 72 are used to hold the grill 18 in place. At least three magnets are most preferred that are uniformly spaced around the perimeter of the grill 18 to provide the optimum holding power. While a greater number of magnets may be utilized to allow a reduction in the size of each individual magnet, more magnets means more bosses 70 which increases the disruption of the contoured wall 64. In one specific embodiment, for an eight inch speaker assembly, the grill 18 has a diameter of about 9½ inches. For this size grill, the three permanent magnets have a diameter of less than ½ inch, so the magnets present only a minimal disruption in the contoured wall 64.

As shown in FIG. 2, the face 73 of the magnets 72 is situated slightly beyond the outer wall 62 of the grill support. However, when the grill support 16 is fixed within the speaker enclosure, the magnet faces 73 reside just inside the surface of the facing ring 35. In a further aspect of the invention, the grill 18 includes a visible decorative face 75 and an opposite inner face 77 that engages the magnets 72. It can be appreciated that the inner face is continuous so that the grill can be engaged to the magnets anywhere along the face 77 without requiring a specific orientation of the grill relative to the mounting fixture or grill support.

Figure 3:
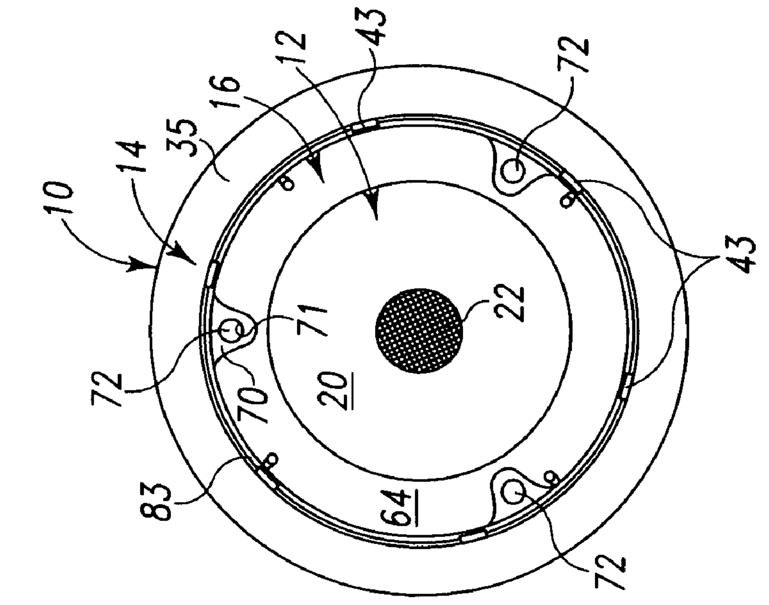
FIG. 3 is a front elevational view of the architectural speaker assembly of FIGS. 1-2 with the speaker grill removed.

In a further feature of the invention, the grill defines an outer rim 79. This outer rim 79 fits within a circumferential channel 83 (show in FIG. 3) defined between the outer wall 62 of the grill support 16 and the side wall 41 of the mounting fixture 14 when the grill support is mounted within the enclosure 37 of the fixture. The outer rim 79 fits snugly within this channel to present a substantially continuous appearance between the facing ting 35 and the grill 18. In addition, the outer rim 79 eliminates exposed edges of the grill that may be snagged to inadvertently dislodge the grill from the speaker assembly. The channel 83 (see in FIG. 3) has an outer diameter that is slightly greater than the outer diameter of the grill rim 79 (see in FIG. 2) to provide access for a prying tool, such as a thin screwdriver, to dislodge the grill.

The illustrated embodiment relates to a preferred circular speaker assembly 10. However, the present invention can be used for other shapes of speaker enclosures, such as rectangular. Of course, the shape of the grill may be modified to accommodate the different speaker enclosure shapes. Moreover, depending upon the shape, additional magnets 72 may be provided. For instance, for a rectangular enclosure and grill, four magnets may be preferred, with one magnet at each corner of the rectangular grill.

The present invention provides an architectural speaker assembly that incorporates a magnetic interface to support a flush mounted grill. This magnetic interface is preferably accomplished by a number of discrete permanent magnets. For a circular speaker grill, three individual magnets are preferably used to support the grill while minimizing the intrusion of the magnets and their support bosses into the acoustic opening of the speaker.

In one feature of the invention, the magnets are mounted in a grill support that is attached to a mounting fixture configured to mount the speaker assembly in a ceiling or wall. The grill support cooperates with the mounting fixture to restrain the speaker. In addition, the grill support cooperates with the mounting fixture to support the grill substantially flush with the facing ring of the mounting fixture. In a further feature, the grill includes an outer rim that is concealed within a channel defined between the grill support and the mounting fixture. In yet another aspect of the invention, the grill support defines a contoured surface on which the magnets are supported, with the surface contoured to preserve the acoustic performance of the speaker.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

For instance, while the preferred embodiment contemplates that the entire grill is formed of a magnetic material, only portions of the grill need include the magnetic material. In an alternative embodiment, discrete strips of magnetic material can be affixed to the grill for engagement with the magnets 72. In this embodiment, the grill itself may be formed of aluminum with a ring of magnetic material affixed to the inner face 77 radially aligned with the magnets 72.

As a further alternative, the ring of magnetic material can itself be a magnet. In this alternative, the magnets 72 mounted in the bosses 70 need not be magnets themselves, but instead may simply be a material that is attracted to magnetic force.

In the preferred embodiment, the front wall 64 of the grill support 16 is contoured or concave, with the magnet bosses 70 projecting away from the wall. Alternatively, the front wall may be substantially flat and/or inclined, but recessed from the front of the support. In this alternative configuration, the magnet bosses 70 will still project forward from the modified wall and will still retain the benefit of the prior embodiment in that the bosses do not impair the acoustic performance of the speaker assembly. This offset wall also retains the acoustic cavity aspect of the contoured wall 64 of the prior embodiment.

It will be appreciated that the mounting fixture 14 and the grill support 16 form a housing for the speaker 12 that may be formed in other ways. For example, the novel features of the mounting fixture 14 and the grill support 16 may be implemented on a single housing structure or housing assembly.

We claim:

1. An architectural speaker assembly comprising:
a speaker including a speaker mounting ring;
a mounting fixture configured to support the speaker within a ceiling or wall or a room, the mounting fixture including a first wall defining a speaker enclosure and a mounting ring integral with said first wall, wherein the speaker mounting ring is configured to mate with said mounting ring of said mounting fixture;
a grill configured to at least partially conceal the speaker;
a grill support engaged to said mounting fixture, said grill support defining a wall surrounding said speaker and having an inclined upper surface offset from said grill, said grill support including a number of bosses projecting from the inclined upper surface toward said grill, and an inner wall engaging said speaker mounting ring; and
a magnetic interface between each of said bosses and said grill.

2. The architectural speaker assembly of claim 1, wherein:
said grill is configured to be attractable by magnetic forces; and
said magnetic interface includes a number of permanent magnets, each supported by corresponding one of said number of bosses.

3. The architectural speaker assembly of claim 2, wherein said bosses define a bore sized to receive a corresponding one of said permanent magnets therein, and the magnets are affixed within the bore with glue or epoxy.

4. The architectural speaker assembly of claim 2, wherein:
said grill includes an outer rim; and
said grill support and said mounting fixture are configured to define a perimeter groove therebetween sized to receive said outer rim when the grill is magnetically engaged to the number of permanent magnets.

5. The architectural speaker assembly of claim 1, wherein said magnetic interface includes:
a number of permanent magnets affixed to said grill; and
a like number of magnetic elements supported by a corresponding one of said number of bosses.

6. The architectural speaker assembly of claim 1, wherein said inclined upper surface forms a concave wall surrounding the speaker.

7. The architectural speaker assembly of claim 1, wherein said mounting fixture and said grill support include opposing screw bosses aligned to receive a mounting screw passing through said mounting fixture into said grill support to engage the grill support to the mounting fixture.

8. The architectural speaker assembly of claim 1, wherein the mounting fixture includes an annular flange extending radially outward from one end of the first wall.

9. The architectural speaker assembly of claim 8, wherein the cylindrical outer wall and the annular flange are integrally formed.

10. The architectural speaker assembly of claim 1, wherein the speaker comprises a co-axial speaker.

11. The architectural speaker assembly of claim 10, wherein the mounting fixture includes an annular flange extending radially outward from one end of the first wall.

* * * * *